US008233276B2

(12) United States Patent
Wu et al.

(10) Patent No.: US 8,233,276 B2
(45) Date of Patent: Jul. 31, 2012

(54) TILT MECHANISM FOR ELECTRONIC DEVICE

(75) Inventors: Kun-Tsan Wu, Shindian (TW); Wei-Shan Hu, Shindian (TW)

(73) Assignee: FIH (Hong Kong) Limited, Kowloon (HK)

( * ) Notice: Subject to any disclaimer, the term of this patent is extended or adjusted under 35 U.S.C. 154(b) by 208 days.

(21) Appl. No.: 12/825,494

(22) Filed: Jun. 29, 2010

(65) Prior Publication Data

US 2011/0188183 A1 Aug. 4, 2011

(30) Foreign Application Priority Data

Feb. 4, 2010 (CN) .......................... 2010 1 0301183

(51) Int. Cl.
*G06F 1/16* (2006.01)
*G06F 3/02* (2006.01)
*H04M 1/00* (2006.01)
(52) U.S. Cl. ......... 361/679.55; 361/679.26; 361/679.27; 361/679.56; 345/168; 345/169; 345/905; 455/575.1; 455/575.3; 455/575.4
(58) Field of Classification Search .......... 361/679.01–679.45, 679.55–679.59; 345/156, 157, 168, 169, 905; 455/575.1, 455/575.3, 575.4
See application file for complete search history.

(56) References Cited

U.S. PATENT DOCUMENTS

| 6,798,649 | B1 * | 9/2004 | Olodort et al. | 361/679.13 |
| 7,448,872 | B2 * | 11/2008 | Im | 439/10 |
| 7,611,113 | B2 * | 11/2009 | Lai | 248/286.1 |
| 7,872,861 | B2 * | 1/2011 | Ou et al. | 361/679.27 |
| 8,081,449 | B2 * | 12/2011 | Lin et al. | 361/679.56 |
| 2002/0080570 | A1 * | 6/2002 | Riddiford | 361/683 |
| 2010/0061049 | A1 * | 3/2010 | Shen | 361/679.21 |

* cited by examiner

*Primary Examiner* — Jayprakash N Gandhi
*Assistant Examiner* — Nidhi Desai
(74) *Attorney, Agent, or Firm* — Altis Law Group, Inc.

(57) ABSTRACT

An electronic device includes a first section, a second section attached to the first section, and a tilt mechanism. The tilt mechanism connects the first section to the second section. The tilt mechanism includes a plate and two hinge assemblies. The plate hinges the first section. Each of the hinge assemblies includes a sleeve and a main shaft rotatably assembled in the sleeve. The sleeve is secured on the second section; the main shaft non-rotatably fixed to the plate. The second section slides relative to the first section, the plate and the main shaft rotate relative to the second section, the plate further supports the second section to a tilted orientation.

12 Claims, 8 Drawing Sheets

TILT MECHANISM FOR ELECTRONIC DEVICE

CROSS-REFERENCE TO RELATED APPLICATIONS

This application is related to co-pending U.S. patent application Ser. No. 12/825,489, entitled "TILT MECHANISM FOR ELECTRONIC DEVICE", by Wu et al. These applications have the same assignee as the present application and have been concurrently filed herewith. The above-identified applications are incorporated herein by reference.

BACKGROUND

1. Technical Field

The present disclosure generally relates to electronic devices, and particularly to a tilt mechanism for an electronic device.

2. Description of Related Art

Portable electronic devices such as mobile phones, laptops, and personal digital assistants (PDAs) are widely used. Slide-type portable electronic devices have been on the increase. A slide-type portable electronic device has two housings, of which one slides relative to the other by a slide mechanism to open/close the portable electronic device.

However, the slide-type portable electronic devices typically only allow the two housings to slide parallel to each other. Therefore, when the slide-type portable electronic device is placed on a horizontal plain or position, it can be difficult for users to view a display screen displayed on the housing.

Therefore, there is room for improvement within the art.

BRIEF DESCRIPTION OF THE DRAWINGS

Many aspects of the tilt mechanism for electronic device can be better understood with reference to the following drawings. The components in the drawings are not necessarily to scale, the emphasis instead being placed upon clearly illustrating the tilt mechanism for electronic device. Moreover, in the drawings, like reference numerals designate corresponding parts throughout the several views.

DETAILED DESCRIPTION

Figure 1:
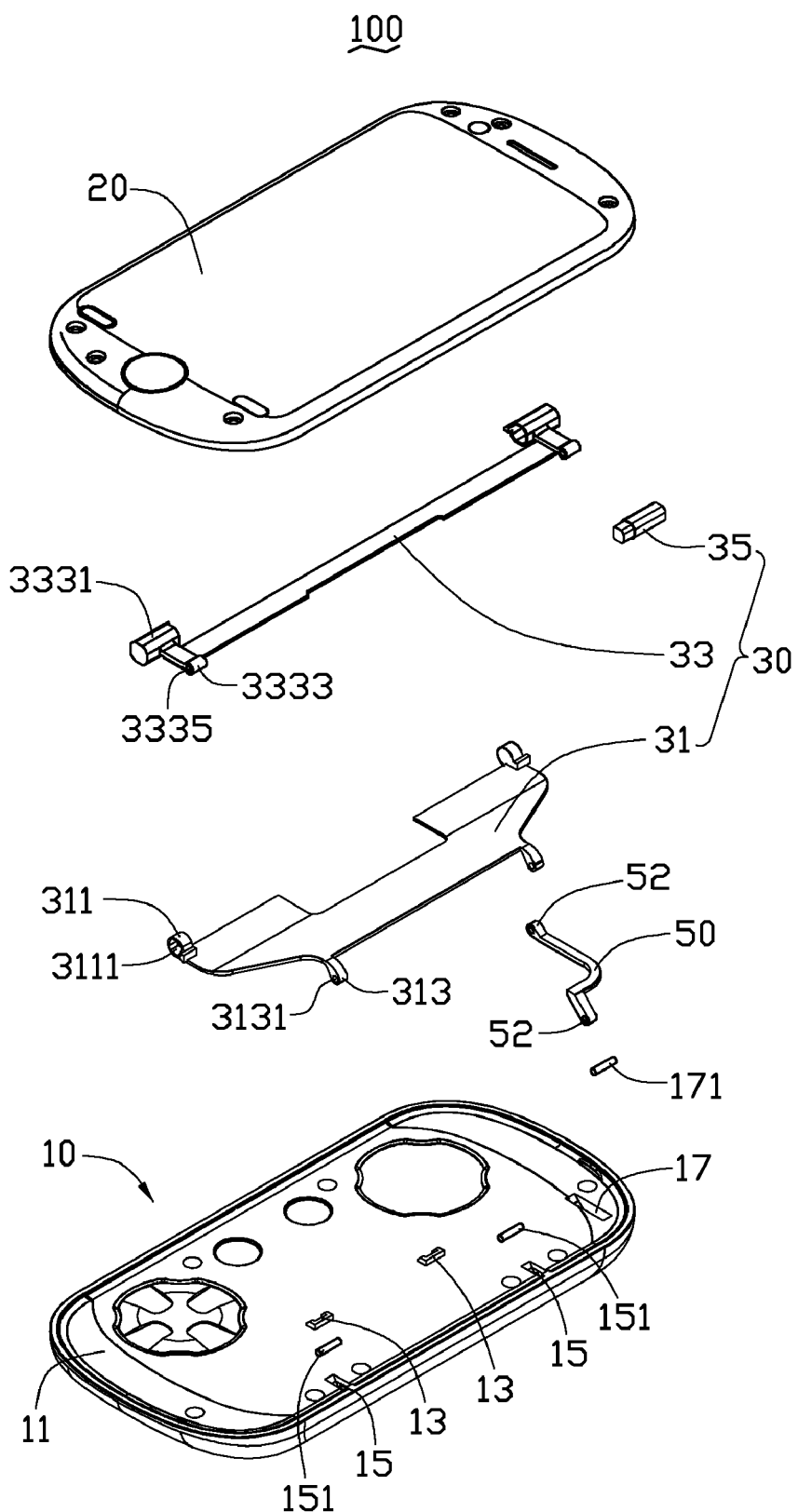
FIG. 1 is an exploded, isometric view of an electronic device according to an exemplary embodiment.
Figure 2:
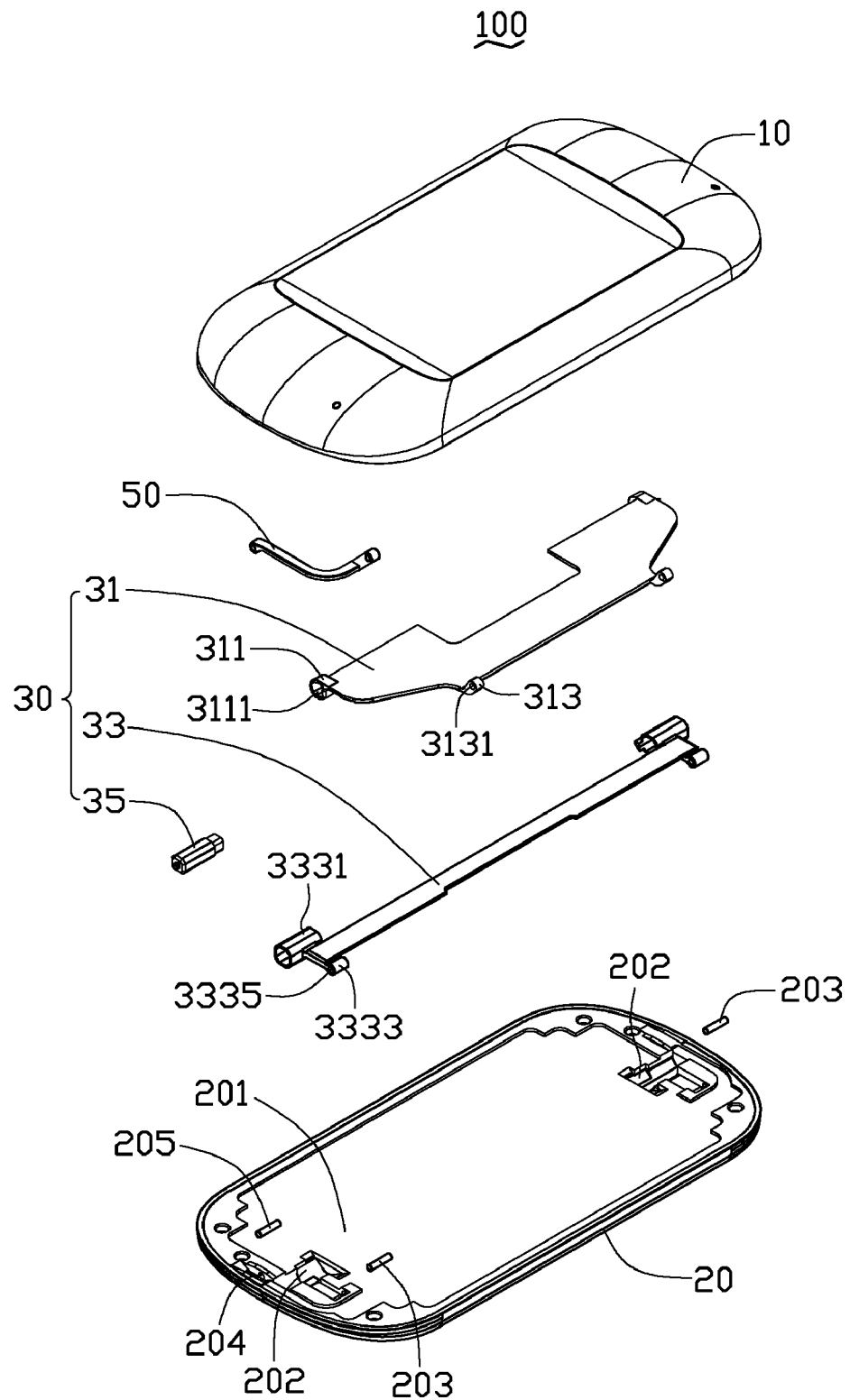
FIG. 2 is similar to FIG. 1, but shown from another angle.

FIG. 1 and FIG. 2 show an exemplary embodiment of an electronic device 100, such as a mobile phone, or a personal digital assistant. The electronic device 100 can be in a closed orientation and a tilted open orientation. The electronic device 100 includes a first section 10, a second section 20, a tilt mechanism 30, and an arm member 50. In the closed orientation, the first section 10 and the second section 20 overlap each other. In the tilted open orientation, the second section 20 may be angularly adjusted relative to the first section 10 for better viewing.

The first section 10 includes a first surface 11 and two protrusions 13 positioned on the first surface 11. The protrusions 13 function as stops for the second section 20 when the electronic device 100 is opened. The first surface 11 faces the second section 20 when the electronic device 100 is in the closed orientation. The first surface 11 defines two first slots 15 and a second slot 17. The first slots 15 are spaced apart and defined adjacent to one side of the first surface 11. Two first pins 151 engage the corresponding first slots 15. The second slot 17 is defined adjacent to an end of the first surface 11, and a second pin 171 engages the second slot 17.

The second section 20 includes a second surface 201 facing the first surface 11 when the electronic device 100 is closed. The second surface 201 defines two first chambers 202 and a second chamber 204. Each first chamber 202 is defined adjacent to one of the ends of the second section 20. The second chamber 204 is defined on one side of the second section 20, where the arm member 50 will be used, adjacent to one of the first chambers 202. Two first posts 203 engage corresponding first chambers 202. A second post 205 engages the second chamber 204.

The tilt mechanism 30 includes a plate 31, an adapting element 33 and two hinge assemblies 35. The plate 31 includes two connecting portions 311 and two connecting arms 313. The connecting portions 311 may be cylindrical, with each connecting portion 311 extending from one of the two ends of the plate 31. Each connecting portion 311 defines an assembly hole 3111. The connecting arms 313 protrude from one sidewall of the plate 31. Each connecting arm 313 defines a through hole 3131. The adapting element 33 may be a bar shaped element attached to the second section 20. Two knuckles 3331 and two tube portions 3333 are symmetrically fixed at opposite ends of the adapting element 33. An end of each knuckle 3331 is sealed for receiving one of the hinge assemblies 35. Each tube portion 3333 defines a connecting hole 3335 for attaching the adapting element 33 to the second section 20 with the first posts 203.

Figure 3:
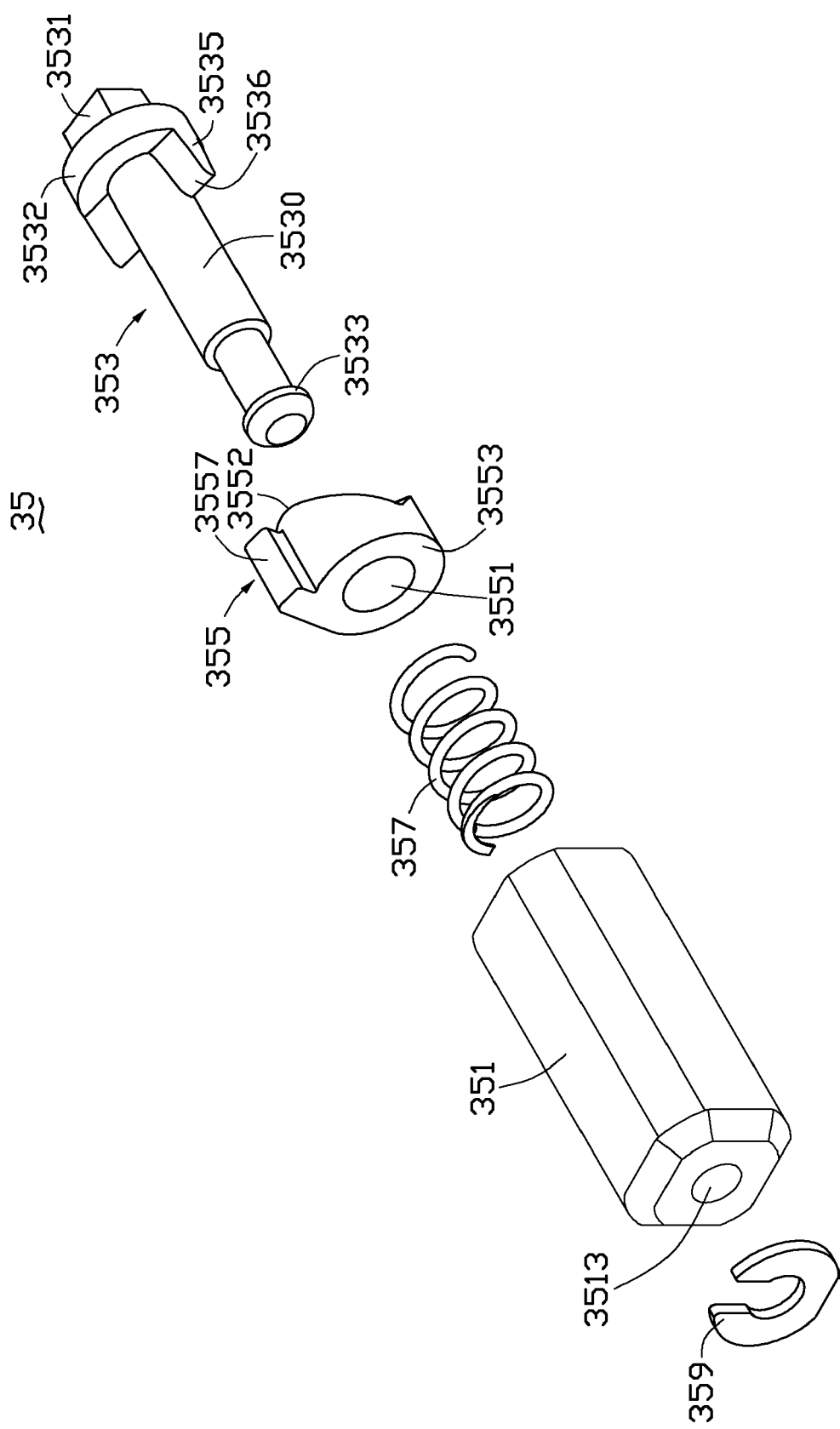
FIG. 3 is an exploded, isometric view of a hinge assembly used in the electronic device shown in FIG. 1.
Figure 4:
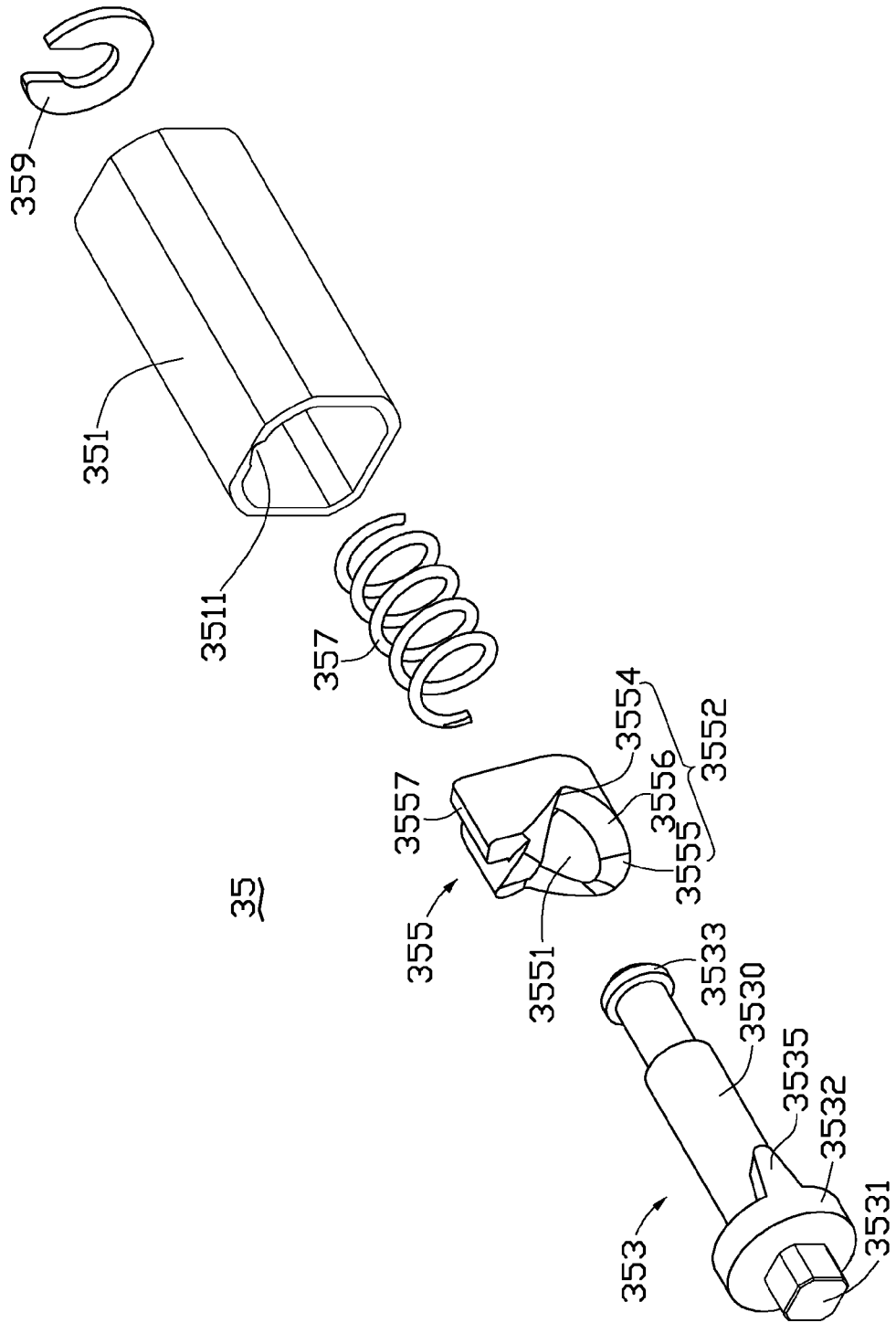
FIG. 4 is an exploded, isometric view of the hinge assembly in FIG. 3, but shown from another angle.

Referring to FIGS. 3 and 4, each hinge assembly 35 includes a sleeve 351, a main shaft 353, a follower 355, a resilient element 357, and a latch 359. The sleeve 351 can be inserted into a corresponding knuckle 3331 and can not rotate relative to the knuckles 3331. Along the inner wall of the sleeve 351 defines a sliding groove 3511 along a longitudinal direction within the sleeve 351. One end of the sleeve 351 defines an opening 3513. The main shaft 353 includes a shaft portion 3530, a flange 3531, a disk portion 3532, and a flange portion 3533. The disk portion 3532 is positioned at an end of the shaft portion 3530, and includes two finger portions 3535 symmetrically positioned along the shaft portion 3530. Each finger portion 3535 includes a top portion 3536. The flange 3531 extends from the disk portion 3532 away from the shaft portion 3530. The flange 3531 matches the assembly hole 3111 and can not rotate relative to each connecting portion 311. Thus, the main shaft 353 can rotate with the plate 31. The flange portion 3533 is positioned at the other end of the shaft portion 3530.

The follower 355 defines a through hole 3551, thus, the follower 355 can be placed around the main shaft 353. The follower 355 includes a cam surface 3552 and an opposite planar surface 3553 on opposite sides of the follower 355. The cam surface 3552 includes two symmetrical valleys 3554, two symmetrical peaks 3555, and two slanted surfaces 3556 formed between the valleys 3554 and the peaks 3555. A protrusion 3557 is positioned on an outer peripheral wall of the follower 355, and configured for matching the sliding groove 3511 of the sleeve 351. Thus, the follower 355 can only slide along the sliding groove 3511. The resilient element 357 is a helical spring, in this embodiment, placed around the shaft portion 3530 and received inside the sleeve 351. One end of the resilient element 357 resists the planar surface 3553, the other end of the resilient element 357 resists one end of the sleeve 351 with the opening 3513. The main shaft 353 passes through the through hole 3551, the resilient element 357 and the opening 3513, the flange portion 3533 of the main shaft 353 and extends from the opposite side of the sleeve 351. The latch 359 latches to the flange portion 3533, thus, the resilient element 357, the follower 355, and the main shaft 353 are assembled in the sleeve 351. When the hinge assemblies 35 are in a locked orientation, the flange portion 3533 resist the valleys 3554 of the cam surface 3552.

The arm member 50 may be a curved rod defining a post hole 52 at each end thereof. The second pin 171 and the second post 205 can pass through the post holes 52 for hinging the arm member 50 to the first section 10 and the second section 20.

Figure 5:
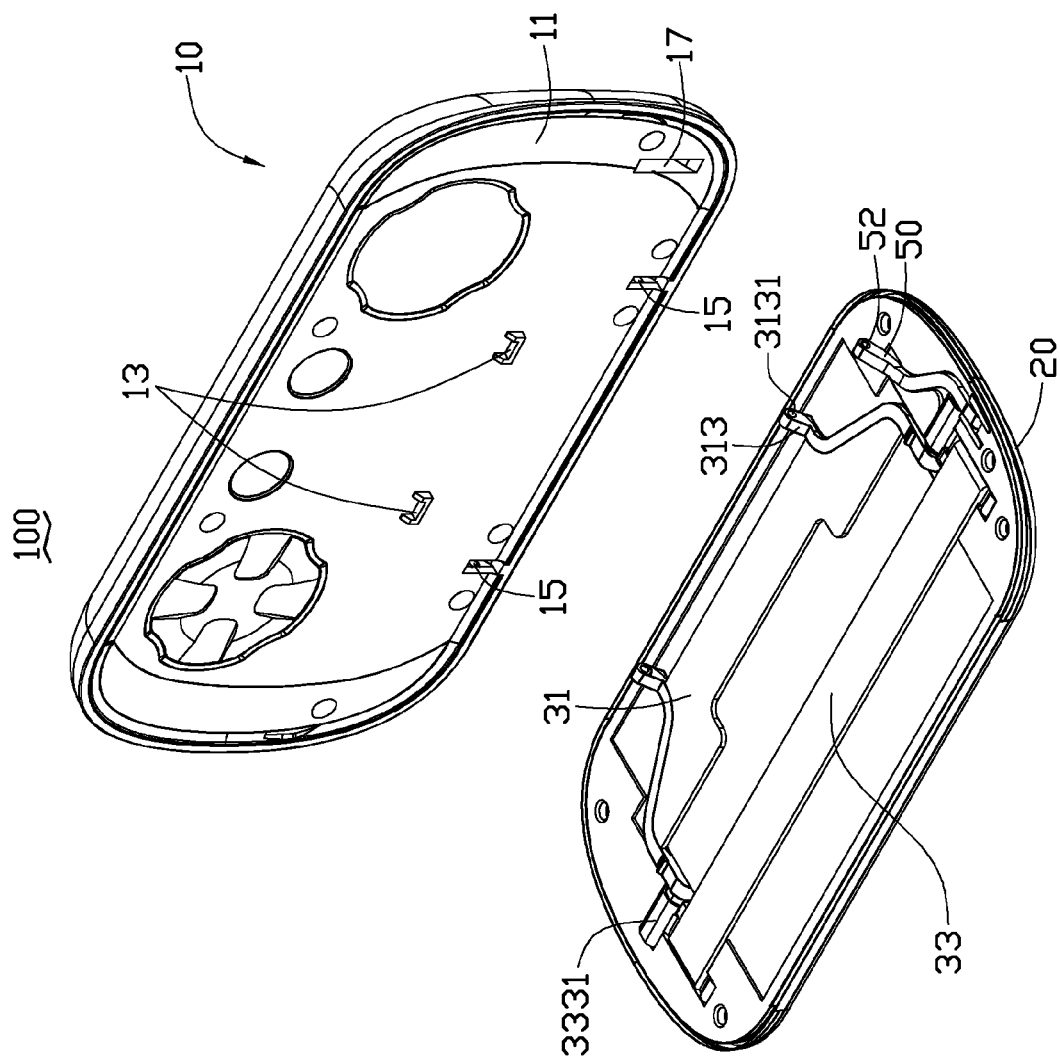
FIG. 5 is an isometric view of a plate assembled to an adapting element used in the electronic device shown in FIG. 1.

Referring to the FIG. 5, in assembly, each sleeve 351 is non-rotatably inserted into the knuckles 3331, and the flange 3531 of each hinge assembly 35 extends from the knuckles 3331. Each flange 3531 is non-rotatably fixed in the assembly hole 3111. The flange 3531 and the plate 31 can rotate relative to the knuckles 3331. Thus, the plate 31 can rotate relative to the adapting element 33 by the hinge assemblies 35. Meanwhile, when the plate 31 and the adapting element 33 are in an unfolded orientation, the plate 31 and the adapting element 33 cooperatively define a 180 degrees angle, and the hinge assemblies 35 are in the locked orientation. Each first pin 151 is inserted into the corresponding through hole 3131 and opposite ends of each first pin 151 is fixed to the first slots 15. Thus, the plate 31 is hinged to the first section 10. Each first post 203 is inserted into the corresponding tube portions 3333 and two ends of each of the first posts 203 are fixed to the first chambers 202. The adapting element 33 is secured to the second section 20 by some type of adhesive bonding or welding. The second pin 171 and the second post 205 are inserted into the post holes 52 and two ends of the second pin 171 and the second post 205 are fixed to the second slot 17 and the second chamber 204.

Figure 6:
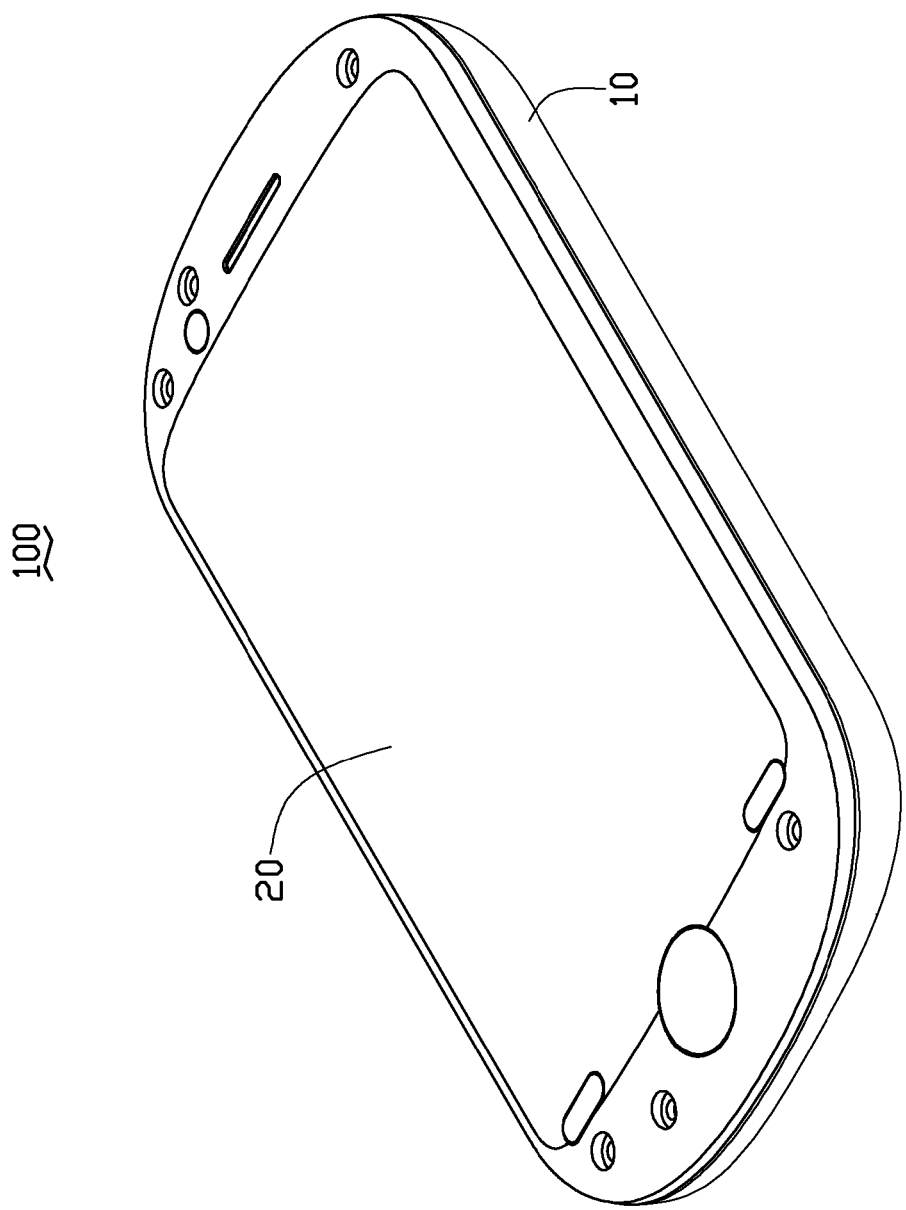
FIG. 6 is an isometric view of the electronic device of FIG. 1 in a closed orientation.
Figure 7:
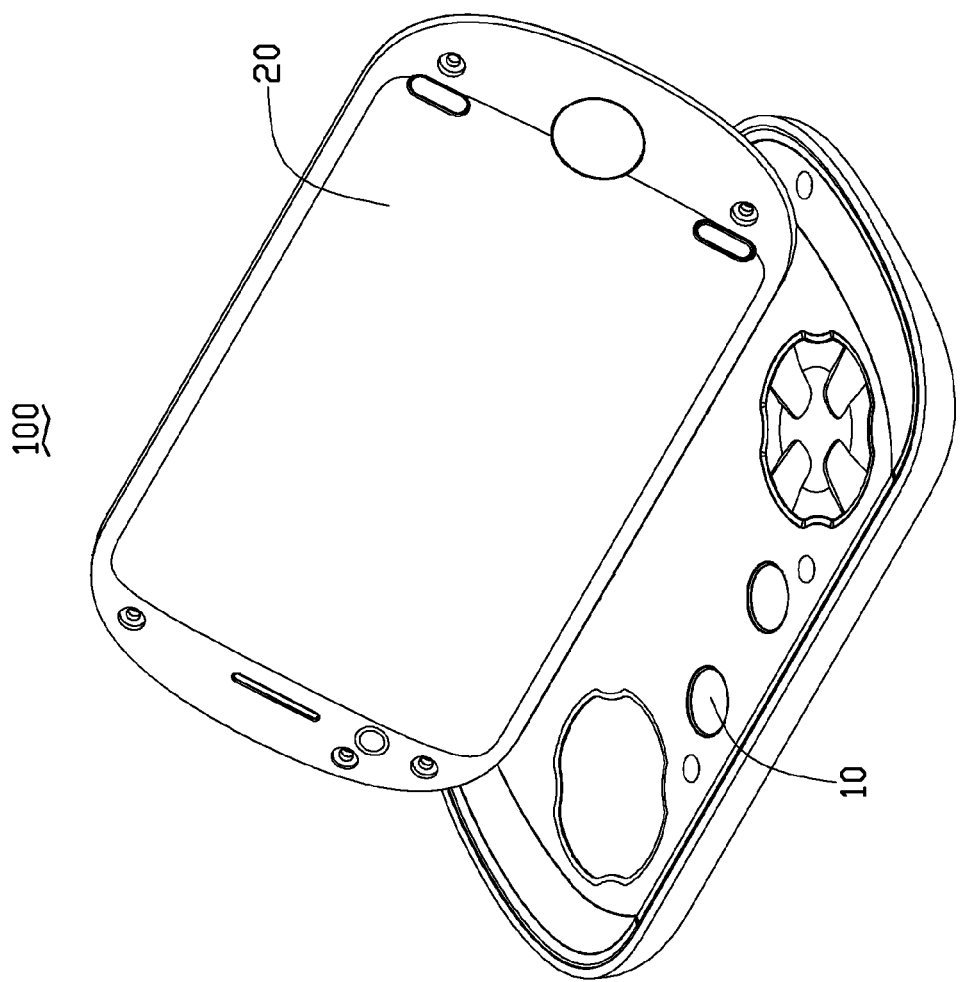
FIG. 7 is an isometric view of the electronic device of FIG. 6 in an open orientation.
Figure 8:
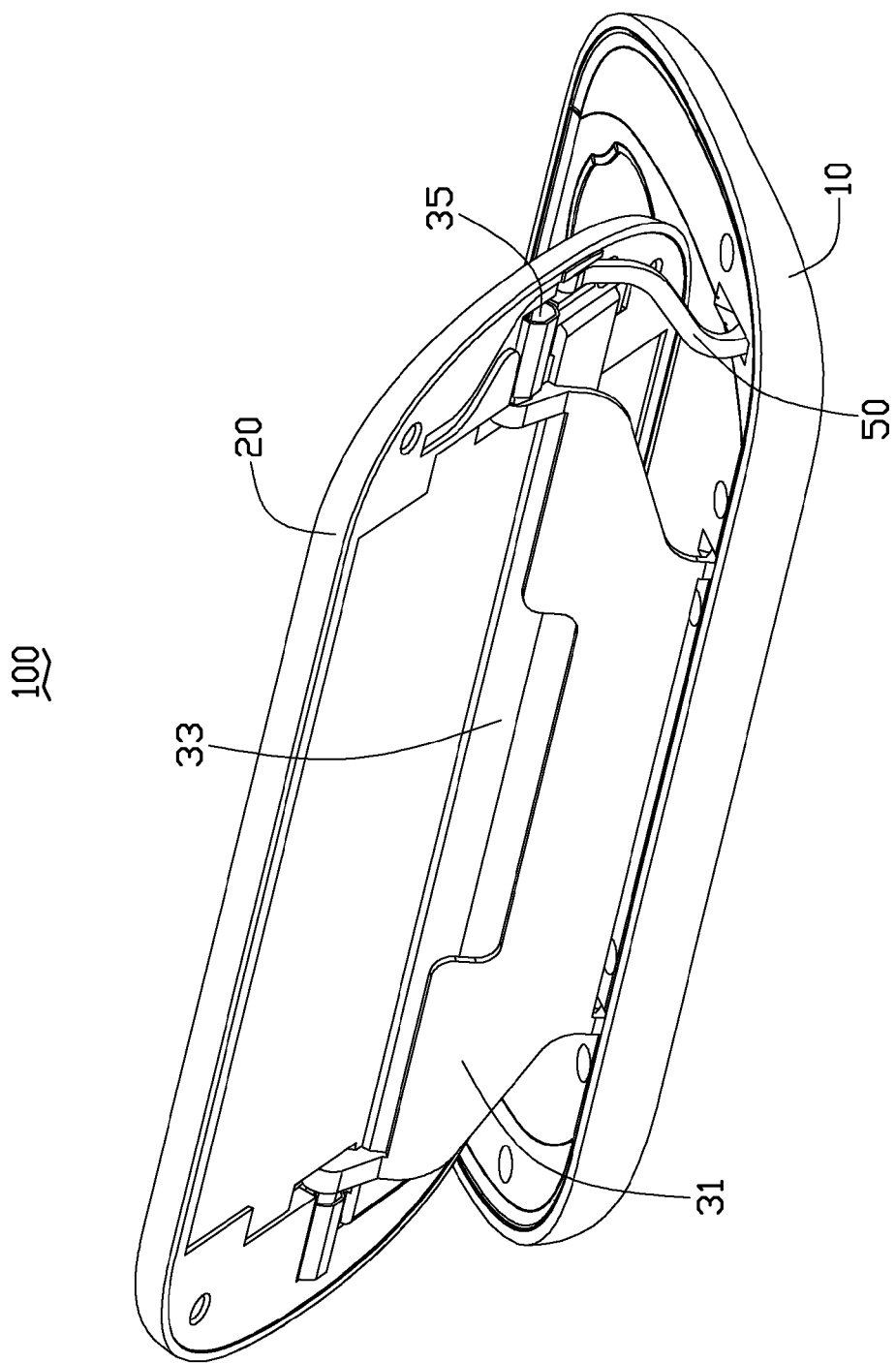
FIG. 8 is an isometric view of the electronic device in FIG. 7, but shown from another angle.

Referring to the FIGS. 6 to 8, when the electronic device 100 is in a closed orientation, the plate 31 and the adapting element 33 are in the unfolded orientation, the finger portions 3535 resist the valleys 3554. When the electronic device 100 is to be opened, a force is applied to the second section 20 to move the second section 20 away from the first section 10. The connecting arms 313 rotate on the first pins 151. The arm member 50 rotates on the second pin 171 and the second post 205. The main shaft 353 is rotated relative to the sleeve 351 by the adapting element 33 and the plate 31. When the finger portions 3535 are released from the valleys 3554, the hinge assemblies 35 are in an unlocked orientation. The finger portions 3535 remain engaged with the slanted surfaces 3556 and resist the follower 355 sliding to the latch 359, the resilient element 357 is compressed, and the adapting element 33 and the sleeve 351 rotate relative to the plate 31. When the finger portions 3535 slide over the peaks 3555, the resilient element 357 pushes the follower 355 sliding to the disk portion 3532, the finger portions 3535 resist the valleys 3554, the hinge assemblies 35 are in the locked orientation once again. Thus, the plate 31 is kept in a tilted open orientation relative to the adapting element 33. The plate 31 and the adapting element 33 are in a folded orientation, the plate 31 and the adapting element 33 cooperatively define a zero degree angle. The plate 31 and the arm member 50 support the second section 20 on the first section 10, and the second section 20 resists the protrusions 13 when the electronic device 100 is fully opened. The second section 20 is supported in tilted position relative to the first section 10.

In other embodiments the arm member 50 can be omitted. The electronic device 100 can be supported only by the tilt mechanism 30.

It is to be understood, however, that even through numerous characteristics and advantages of the present disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An electronic device comprising:
 a first section;
 a second section; and
 a tilt mechanism connecting the first section to the second section, the tilt mechanism comprising:
  a plate hinged to the first section;
  an adapting element secured on the second section; and
  two hinge assemblies, each of the hinge assemblies comprising a sleeve and a main shaft rotatably received in the sleeve; the sleeve being non-rotatably secured in the adapting element; the main shaft non-rotatably fixed to the plate;
 wherein when the second section slides relative to the first section, the plate and the main shaft rotate relative to the second section and the adapting element, the plate supports the second section in a tilted orientation.

2. The electronic device as claimed in claim 1, further comprising an arm member, each end of the arm member hinged to the first section and the second section.

3. The electronic device as claimed in claim 2, wherein the arm member defines two post holes at opposite ends thereof; the first section comprises a second pin and the second section comprises a second post, the second pin and the second post are inserted into the post holes.

4. The electronic device as claimed in claim 1, wherein when the second section is closed relative to the first section, the plate and the adapting element are in an unfolded orientation; when the second section is opened relative to the first section, the plate and the adapting element are in a folded orientation.

5. The electronic device as claimed in claim 1, wherein the main shaft comprises a flange positioned thereon, the plate comprises two connecting portions and two connecting arms; the connecting portions rotatably assembled to the first section, the flange is non-rotatably assembled in the connecting arms.

6. The electronic device as claimed in claim 1, wherein the first section comprises two protrusions positioned thereon, the second section resists the protrusions when the electronic device is opened.

7. An electronic device comprising:
 a first section;
 a second section; and
 a tilt mechanism connecting the first section to the second section, the tilt mechanism comprising:
  a plate hinged to the first section;
  an adapting element secured on the second section; and two hinge assemblies, each hinge assembly comprising a sleeve and a main shaft rotatably assembled in the sleeve; the sleeve being secured in the adapting element; the main shaft non-rotatably fixed to the plate; wherein when the electronic device is in a closed orientation, the hinge assemblies are in locked orientation, and the plate unfolds away from the adapting element; when the electronic device is in an open orientation, the plate folds relative to the adapting element and supports the second section in a tilted orientation.

8. The electronic device as claimed in claim 7, further comprising an arm member, ends of the arm member hinged to the first section and the second section.

9. The electronic device as claimed in claim 8, wherein the arm member defines two post holes at two ends thereof; the first section comprises a second pin and the second section comprises a second post, the second pin and the second post are inserted into the respective post holes.

10. The electronic device as claimed in claim 7, wherein the main shaft comprises a flange positioned thereon, the plate comprises two connecting portions and two connecting arms; each connecting portion rotatably assembled to the first section, the flange non-rotatably assembled to the connecting arms.

11. The electronic device as claimed in claim 10, wherein the main shaft further comprises a post and a disk portion; the disk portion is positioned at an end of the post and comprises two finger portions extending along the post; each hinge assemblies comprises a follower including two valleys, the finger portions resist the valleys when the hinge assemblies are in the locked orientation.

12. The electronic device as claimed in claim 7, wherein the first section comprises two protrusions positioned thereon, the second section resists the protrusions when the electronic device is opened.

* * * * *